(12) United States Patent
Maruyama

(10) Patent No.: US 8,143,075 B2
(45) Date of Patent: Mar. 27, 2012

(54) SEMICONDUCTOR MANUFACTURE METHOD

(75) Inventor: Takashi Maruyama, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 537 days.

(21) Appl. No.: 11/300,276

(22) Filed: Dec. 15, 2005

(65) Prior Publication Data
US 2006/0223200 A1 Oct. 5, 2006

(30) Foreign Application Priority Data
Mar. 31, 2005 (JP) .................................. 2005-100458
Sep. 27, 2005 (JP) .................................. 2005-279561

(51) Int. Cl.
*H01L 21/00* (2006.01)
(52) U.S. Cl. ......... 438/7; 438/16; 438/401; 257/E21.53; 257/E23.179
(58) Field of Classification Search ................ 438/7, 16, 438/14, 401; 216/2; 257/797, E23.179, E21.529, 257/E21.53
See application file for complete search history.

(56) References Cited

U.S. PATENT DOCUMENTS

| | | | | | |
|---|---|---|---|---|---|
| 4,413,186 | A | * | 11/1983 | Uema ........................ | 250/491.1 |
| 4,566,796 | A | * | 1/1986 | Leebrick ..................... | 356/401 |
| 4,770,533 | A | * | 9/1988 | Suwa ......................... | 356/620 |
| 5,004,925 | A | * | 4/1991 | Takahashi et al. ......... | 250/491.1 |
| 5,091,285 | A | * | 2/1992 | Watanabe et al. ........... | 430/296 |
| 5,301,124 | A | * | 4/1994 | Chan et al. .................... | 430/22 |
| 5,412,210 | A | * | 5/1995 | Todokoro et al. ............ | 850/9 |
| 5,418,613 | A | * | 5/1995 | Matsutani ................... | 356/401 |
| 5,972,772 | A | | 10/1999 | Sasaki et al. | |
| 6,285,455 | B1 | * | 9/2001 | Shiraishi ..................... | 356/486 |
| 6,399,953 | B1 | * | 6/2002 | Kitamura .................... | 250/491.1 |
| 6,440,816 | B1 | * | 8/2002 | Farrow et al. ............... | 438/401 |
| 7,235,455 | B2 | * | 6/2007 | Maruyama .................. | 438/401 |
| 2001/0003655 | A1 | * | 6/2001 | Tokunaga ..................... | 438/1 |
| 2001/0006216 | A1 | * | 7/2001 | Koike ......................... | 250/398 |
| 2001/0042068 | A1 | * | 11/2001 | Yoshida et al. .............. | 707/102 |
| 2002/0142235 | A1 | * | 10/2002 | Hamanaka et al. ............ | 430/5 |

(Continued)

FOREIGN PATENT DOCUMENTS

JP H05-190435 A 7/1993

(Continued)

OTHER PUBLICATIONS

Japanese Office Action mailed by the JPO in connection with corresponding Japanese Patent Appln. 2005-279561, on Dec. 8, 2009. Partial English-language translation provided.

*Primary Examiner* — Matthew Landau
*Assistant Examiner* — Latanya N Crawford
(74) *Attorney, Agent, or Firm* — Fujitsu Patent Center

(57) ABSTRACT

A semiconductor device manufacture method has the steps of: (a) forming a semiconductor device structure in a chip and alignment marks, respectively in a semiconductor wafer; (b) forming a workpiece layer above the semiconductor wafer; (c) exposing the alignment marks; (d) coating an electron beam resist film on the workpiece layer; (e) scanning the alignment marks with an electron beam to obtain plural position information on the alignment marks and obtaining differences between the plural position information; (f) removing abnormal values of position information in accordance with the difference between the plural position information; and (g) performing an electron beam exposure in accordance with plural position information of the alignment marks with the abnormal value being removed. An alignment mark detection precision can be improved in electron beam exposure.

22 Claims, 12 Drawing Sheets

U.S. PATENT DOCUMENTS

| | | | |
|---|---|---|---|
| 2004/0047938 A1* | 3/2004 | Kosuga et al. | 425/406 |
| 2004/0059540 A1* | 3/2004 | Matsumoto et al. | 702/150 |
| 2004/0135226 A1* | 7/2004 | Yoshimura et al. | 257/499 |
| 2004/0198017 A1* | 10/2004 | Chang et al. | 438/401 |
| 2004/0198018 A1* | 10/2004 | Fukuda | 438/401 |
| 2004/0264759 A1* | 12/2004 | Hattori et al. | 382/145 |
| 2005/0117154 A1* | 6/2005 | McArthur et al. | 356/401 |
| 2006/0085161 A1* | 4/2006 | Smeets et al. | 702/150 |
| 2007/0002298 A1* | 1/2007 | Visser | 355/55 |

FOREIGN PATENT DOCUMENTS

| | | |
|---|---|---|
| JP | H07-302741 A | 11/1995 |
| JP | 8-17696 | 1/1996 |
| JP | H08-111363 A | 4/1996 |
| JP | 9-36019 | 2/1997 |
| JP | H10-079339 | 3/1998 |

* cited by examiner

FIG. 9A

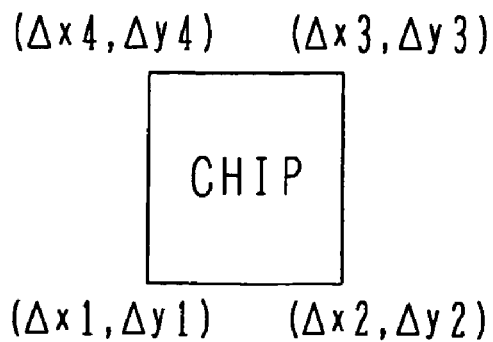

($\Delta x4, \Delta y4$)   ($\Delta x3, \Delta y3$)

CHIP ($\Delta x1, \Delta y1$)   ($\Delta x2, \Delta y2$)

FIG. 9B $$\begin{Bmatrix} O_x \\ G_x \\ R_x \\ H_x \end{Bmatrix} = \begin{Bmatrix} 1 & X1 & Y1 & X1 \times Y1 \\ 1 & X1 & Y1 & X1 \times Y1 \\ 1 & X1 & Y1 & X1 \times Y1 \\ 1 & X1 & Y1 & X1 \times Y1 \end{Bmatrix}^{-1} \begin{Bmatrix} \Delta X1 \\ \Delta X2 \\ \Delta X3 \\ \Delta X4 \end{Bmatrix}$$

$$\begin{Bmatrix} O_y \\ G_y \\ R_y \\ H_y \end{Bmatrix} = \begin{Bmatrix} 1 & X1 & Y1 & X1 \times Y1 \\ 1 & X1 & Y1 & X1 \times Y1 \\ 1 & X1 & Y1 & X1 \times Y1 \\ 1 & X1 & Y1 & X1 \times Y1 \end{Bmatrix}^{-1} \begin{Bmatrix} \Delta Y1 \\ \Delta Y2 \\ \Delta Y3 \\ \Delta Y4 \end{Bmatrix}$$

SEMICONDUCTOR MANUFACTURE METHOD

CROSS REFERENCE TO RELATED APPLICATION

This application is based on and claims priority of Japanese Patent Applications No. 2005-100458 filed on Mar. 31, 2005 and No. 2005-279561 filed on Sep. 27, 2005, the entire contents of which are incorporated herein by reference.

BACKGROUND OF THE INVENTION

A) Field of the Invention

The present invention relates to a semiconductor device manufacture method, and more particularly to a semiconductor manufacture method by which a workpiece is processed by electron beam exposure.

B) Description of the Related Art

In manufacturing a semiconductor integrated circuit device, lithography is used to form a resist pattern by coating a resist layer on a workpiece layer and exposing and developing it. A precision of lithography is an important factor governing a precision, integration degree and the like of a semiconductor integrated circuit device.

Electron beam (EB) exposure has a high resolution and is suitable for micro processing in forming a pattern. EB exposure can draw a very thin pattern in a unit area of generally several μm, e.g., 4 μm at a maximum. EB exposure allows correction of alignment in a very fine unit.

If EB exposure is performed in a chip unit, as shown in FIG. 9A, alignment marks at four corners of a chip are detected, and a deflection and the like of an electron beam are aligned and exposure is performed. Alignment includes, along X- and Y-directions, contraction factors Gx and Gy, rotation Rx and Ry, trapezoid Hx and Hy, and translation Ox and Oy. The contraction factors Gx and Gy, rotation Rx and Ry, trapezoid Hx and Hy, and translation Ox and Oy can be obtained by matrix calculation shown in FIG. 9B, where (x, y) and (Δx, Δy) are position coordinate values and distortion coordinate values at each of chip four corners, respectively.

In detecting the position of an alignment mark of EB exposure alignment by detecting electrons reflected from the alignment mark, JP-A-HEI-9-36019 Publication proposes a method for raising an alignment mark detection precision by providing a plurality of detectors for reflected electrons and amplifiers and setting an amplification factor of each amplifier to make constant an output intensity.

In order to detect the position of an alignment mark at high precision and at high speed, JP-A-HEI-8-17696 proposes that electron beam scanning for detecting an alignment mark made of a step is performed by first scanning which scans a width larger than the width of the mark and second scanning which scans only the edges of the mark.

Detectors for reflected electrons and amplifiers are used for detecting reflected electrons. It cannot be said that a reflected electron signal is sufficiently strong. If noises are superposed upon the detectors, amplifiers and the like, a signal waveform is deformed, allowing an erroneous detection possibility.

If an erroneous detection occurs, an alignment precision will be lowered unless subsequent processes are corrected.

SUMMARY OF THE INVENTION

An object of the present invention is to improve provision of alignment mark detection in electron beam exposure.

According to one aspect of the present invention, there is provided a semiconductor device manufacture method comprising the steps of: (a) forming a semiconductor device structure in a chip and alignment marks, respectively in a semiconductor wafer; (b) forming a workpiece layer above the semiconductor wafer; (c) exposing the alignment marks; (d) coating an electron beam resist film on the workpiece layer; (e) scanning the alignment marks with an electron beam to obtain plural position information on the alignment marks and obtaining differences between the plural position information; (f) removing abnormal values of position information in accordance with the difference between the plural position information; and (g) performing an electron beam exposure in accordance with plural position information of the alignment marks with the abnormal value being removed.

If noises are superposed upon detectors, amplifiers and the like, there is a possibility of erroneous detection. By utilizing a difference between plural position information, it becomes possible to remove abnormal values of the position information. It is possible to prevent a local position misalignment due to an alignment mark detection error. Local position displacement can be avoided. It is possible to improve an exposure position precision and further improve a pattern position precision.

A position detection time can be shortened, contributing to reducing the number of manufacturing processes.

Semiconductor integrated circuit devices can be made fine and highly reliable, and yield and reliability can be improved. By positively using the function of an electron beam exposure method, a micro pattern can be formed at high precision and a position alignment precision can be improved among others. It is possible to contribute to improvement of yield and reliability of semiconductor integrated circuit devices.

BRIEF DESCRIPTION OF THE DRAWINGS

FIG. 9A is a schematic plan view illustrating an alignment process according to prior art and FIG. 9B shows matrix calculation equations.

DESCRIPTION OF THE PREFERRED EMBODIMENTS

A general detection method for an alignment signal in an EB exposure process analyzes an reflected electron signal obtained by scanning an alignment mark with an electron beam, the alignment mark being made of a step in a layer formed before a workpiece layer is formed.

Figure 1A:
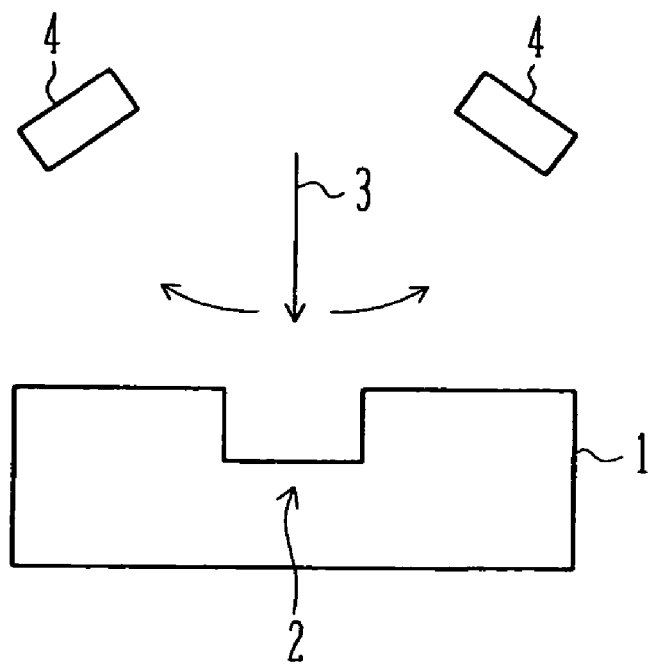
FIGS. 1A and 1B are a diagram illustrating the detection principle for an alignment signal of EB exposure, and an oscillograph showing an example of signal waveforms.
Figure 1B:
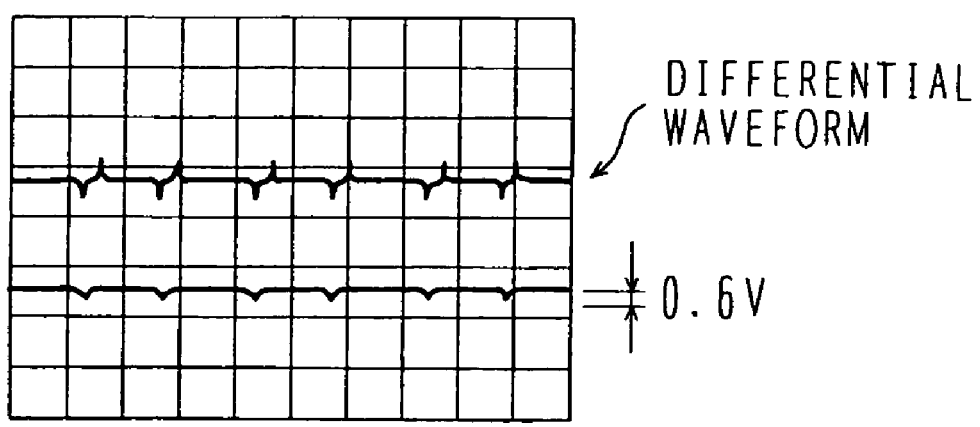

FIGS. 1A and 1B illustrate the principle of detecting an alignment signal in EB exposure.

As shown in FIG. 1A, an alignment mark 2 constituted of a groove (step, concave portion) formed in the surface layer of a silicon substrate 1 is scanned with an electron beam 3, and reflected electrons are detected with detectors 4. An output of the detector is amplified by an amplifier and is sent to an external. If an electron beam is focused on the surface of the silicon substrate, the intensity of reflected electrons is weakened on the bottom of the groove.

FIG. 1B shows signal waveforms on an oscilloscope. The lower signal waveform is obtained when a standard alignment mark having a step of 500 nm is detected. A difference is 0.6 V between high and low levels of the signal. The upper signal waveform is obtained by differentiating the lower signal waveform. The step corresponds to a portion where the differential waveform changes.

Figure 2:
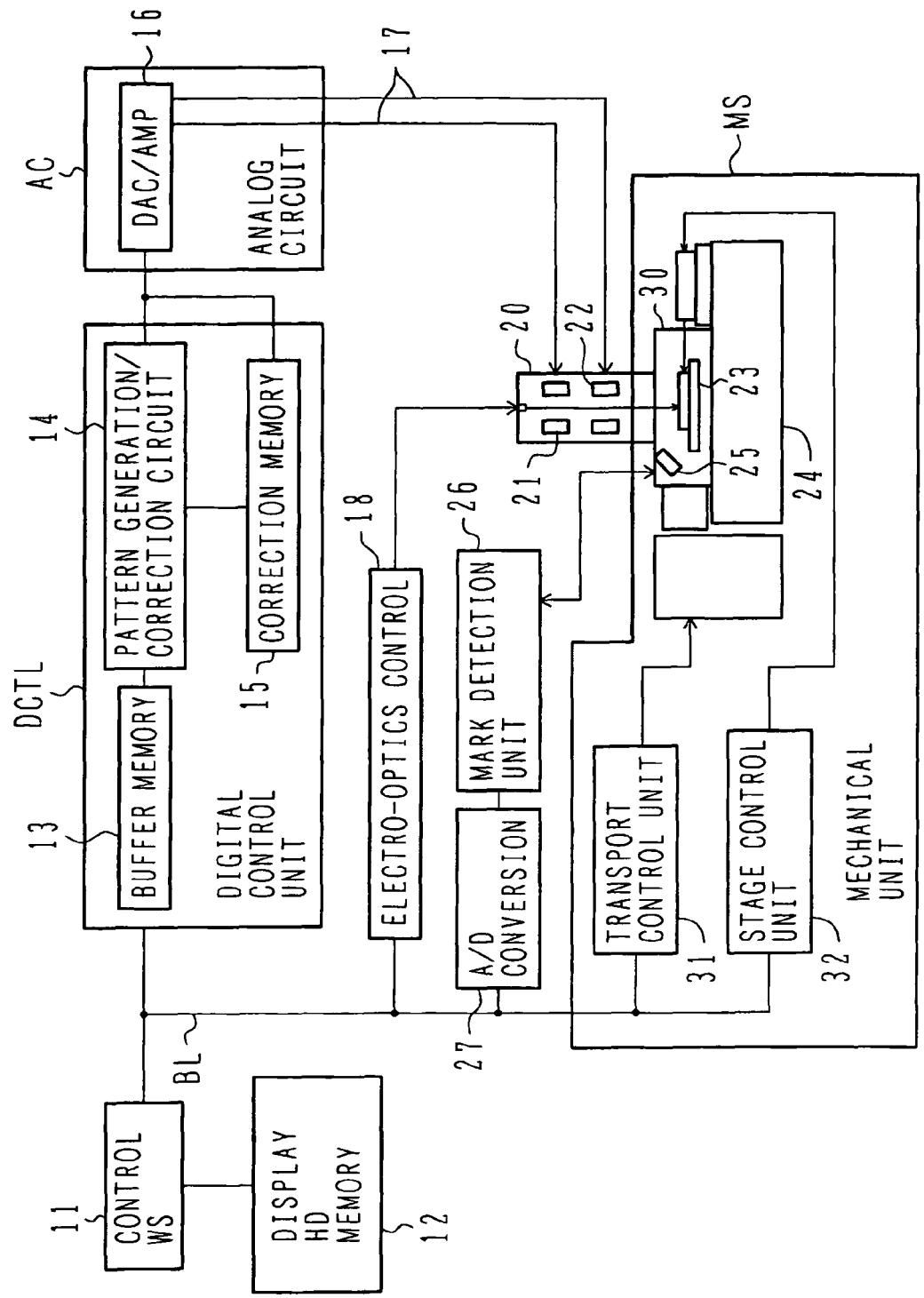
FIG. 2 is a block diagram showing the structure of an exposure system.

FIG. 2 is a diagram showing the structure of an EB exposure system. A control workstation (WS) 11 constituted of a central processing unit (CPU) and the like is connected via a bus line BL to a digital control unit DCTL, an electro-optics control unit 18 and a mechanical unit MS. In the digital control unit DCTL, an input signal is supplied via a buffer memory 13 to a pattern generation/correction circuit 14 which controls an analog circuit AC in cooperation with a correction memory 15. The analog circuit AC includes a DAC/AMP 16 and generates analog control signals 17 to adjusts deflection of an electron beam. The electro-optics control unit 18 controls a column 20.

The column 20 is coupled to an exposure chamber 30 and irradiates an electron beam to a wafer placed on an XY stage 23 in the chamber 30. The chamber 30 is mounted on a vibration proof device 24. A detector 25 for detecting electrons reflected from the wafer is disposed in the chamber 30 and supplies a detected signal to a mark detection unit 26. An output signal of the mark detection unit 26 is analyzed at an A/D conversion—waveform analysis unit 27, and the analysis results in the form of digital signal are supplied to the digital control unit DCTL and control WS 1.

The control WS 11 and digital control unit DCTL control, via the electro-optics unit 18, a transport control unit 31 and a stage control unit 32, deflection of an electron beam in the column and the position of the XY stage 23 in the chamber 30. External apparatuses 12 such as a display, a hard disk and a memory may be connected to the control WS 11.

In an alignment operation, a mark scan signal is output from the pattern generation/correction circuit 14, converted into an analog signal, amplified by DAC/AMP 16, and applied to a deflector. Reflected electrons generated during beam scanning are captured by the detector 25, and amplified by the mark detector 26. Position coordinates of the reflected electrons are calculated by the A/D conversion—waveform analysis unit 27 and transmitted to the digital control unit DCTL. In accordance with the coordinate values obtained in this manner, the control unit DCTL determines an exposure position and performs pattern exposure.

An alignment mark on a wafer uses generally a step in an oxide film, silicon body or the like. A necessary step amount is 0.3 μm or deeper at a minimum. However, depending upon process restrictions, there is a case in which a necessary step amount cannot be obtained, a signal intensity becomes insufficient, and an S/N ratio lowers. There is another case in which even if a mark step amount is sufficient, erroneous detection occurs because of noises on DAC/AMP 16 and the detector 25. In such cases, mark coordinate values are read incorrectly and a local position displacement occurs. A countermeasure against position displacement is difficult because it is not possible to judge which mark coordinate values are correct, from only the position information obtained through position detection.

In semiconductor integrated circuit device manufacture, as the pattern rule becomes very fine, a pattern precision, particularly an alignment precision, becomes a big issue and is a main factor of hindering micro patterning and high reliability of a semiconductor integrated circuit device. Under such circumstances, if the alignment precision is lowered, manufacture yield and reliability are degraded. There is a case wherein local erroneous detection of an alignment signal is hard to be removed because of the influence of fine noises or the like. In the semiconductor integrated circuit device manufacture, deterioration of a position precision, particularly a partial position precision in a wafer, adversely affects the manufacture yield and reliability.

In order to elucidate the circumstances of position precision deterioration, the present inventor analyzed a detection signal of reflected electrons output from the detector 25.

FIGS. 3A to 3D are cross sectional views illustrating preparation of a sample. At the same time when a shallow trench isolation is formed as an element isolation structure in a silicon substrate, an alignment mark groove (concave portion) is formed.

Figure 3A:
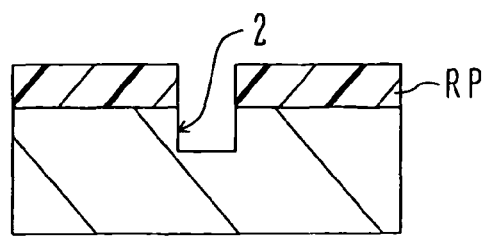
FIGS. 3A to 3D are cross sectional views illustrating preparation of a sample.

As shown in FIG. 3A, a resist pattern RP is formed on a silicon substrate 1, and a groove 2 is formed by etching the silicon substrate. After the resist pattern RP is removed, an oxide film is deposited by high density plasma (HDP) chemical vapor deposition (CVD) to bury the groove 2.

Figure 3B:
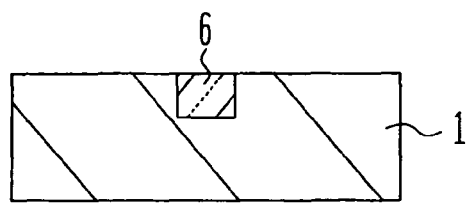

As shown in FIG. 3B, an unnecessary oxide film on the silicon substrate 1 is removed by chemical mechanical polishing (CMP). The inside of the groove 2 is buried with an oxide film 6. Sallow trench isolation is thus formed. Alignment marks 2 buried with oxide film 6 are also formed. In the semiconductor integrated circuit device manufacture, thereafter various processes are executed such as well forming ion implantation, threshold adjusting ion implantation, gate insulating film forming, gate electrode structure forming, and source/drain region forming ion implantation.

Figure 3C:
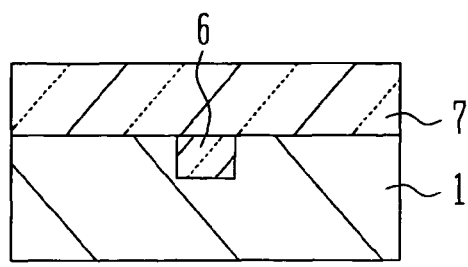

As shown in FIG. 3C, an interlayer insulating film 7 of silicon oxide or the like is formed on the silicon substrate 1. The buried oxide film 6 is also covered with the interlayer insulating film 7. Contact holes will be aligned by using the alignment marks formed by the process of forming shallow trench isolation. It is preferable to expose the step of the alignment mark.

Figure 3D:
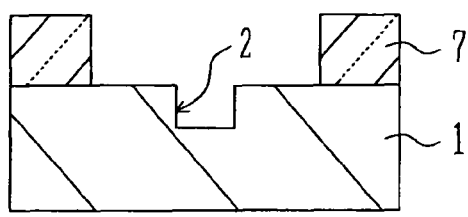

As shown in FIG. 3D, a resist pattern is formed having an opening exposing an area including the buried oxide film 6, and silicon oxide exposed in the opening is etched. The interlayer insulating film 7 and buried oxide film 6 are etched so that the groove 2 formed as the alignment mark is exposed.

As the alignment mark is detected, opposite edges of the groove 2 are detected. The position of the mark is obtained as an average of positions of opposite ends of the groove. The width of the groove was designed, for example, to be 2 μm. If abnormal values are detected because of noises, it is considered that the width of the mark takes also an abnormal value. The mark width can be detected easily by detecting the mark.

Figure 3E:
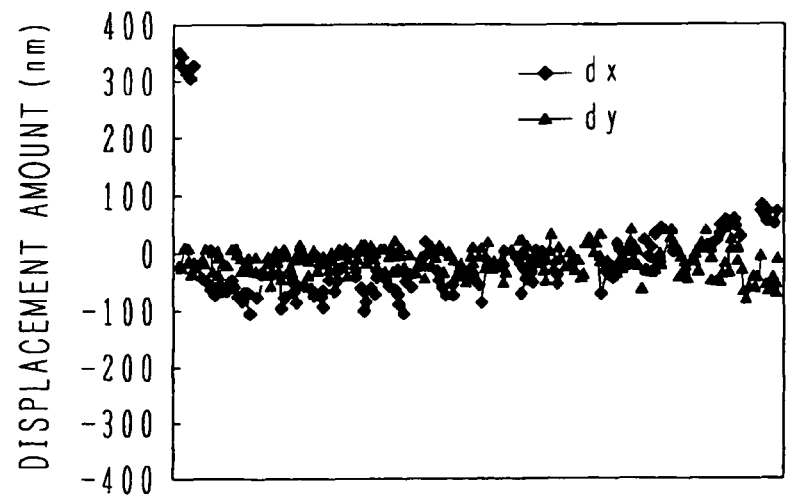
FIG. 3E is a graph showing the measurement results of the sample.

FIG. 3E is a graph showing a displacement amount from the designed mark width of 2 μm obtained by detecting alignment marks on a wafer. X-direction displacement amounts are indicated by rhomboid symbol and Y-direction displacement amounts are indicated by triangle symbol. Although most of detection values are distributed near 0, detection values having a large displacement amount exist at the left end and remote from 0. If alignment is performed by using these remote detection values or detection values containing these remote detection values, an error becomes large. If there are apparent abnormal detection values, normal alignment could be performed by using detection values excluding the remote detection values.

The present inventor proposes a method of removing abnormal values from detection signals of the detector 25 and correcting detection values at high precision and with a simple procedure if noise elimination is difficult, to improve productivity of the semiconductor integrated circuit device manufacture using EB exposure.

The present inventor has also found that information on mark widths obtained from position detection information is effective for removing abnormal values and the abnormal values can be removed very efficiently by positively utilizing the information on mark widths.

Prior to exposure of a product, marks are detected at several points of a wafer, and the width of each mark is obtained. A reference size is decided on the basis of these widths. When each chip is actually aligned, data remote from the reference size is not used or the marks are detected again not to adopt abnormal value data. In this manner, position misalignment is avoided. For example, an average is basically used as the reference value.

In removing abnormal values, it is important to correctly determine the mark width reference value in order to obtain high precision. It is effective that the mark structure is designed so that the mark widths can be determined correctly. If a rounding corner poses a problem, a mark shape long in one direction may be adopted and the central portion not influenced by the corner is monitored.

First Embodiment

Figure 4A:
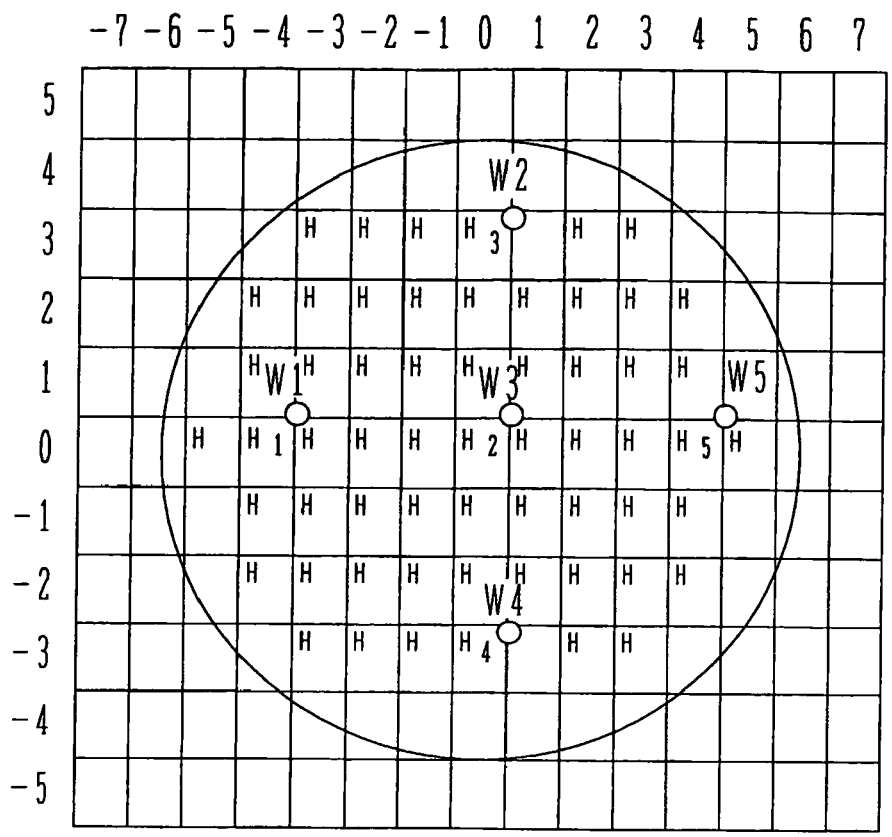
FIGS. 4A and 4B are a plan view and a graph illustrating EB exposure on a semiconductor wafer according to a first embodiment of the present invention.
Figure 4B:
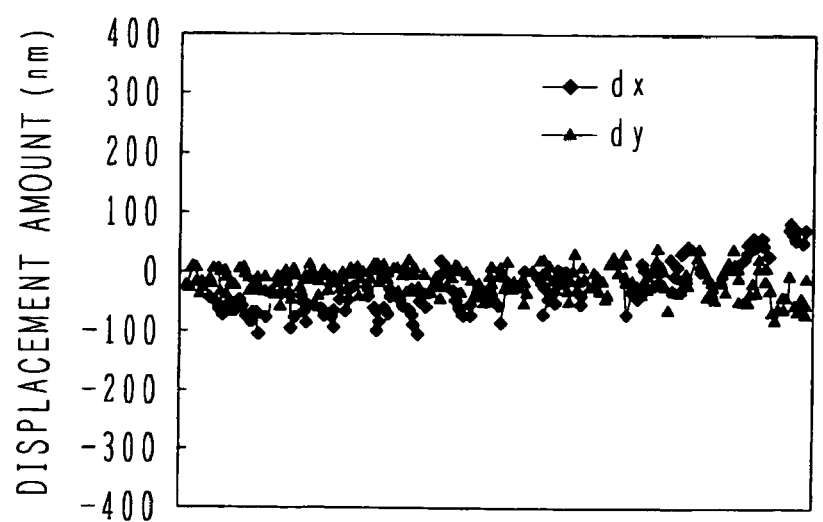

With reference to FIGS. 4A and 4B, EB exposure of the first embodiment will be described. The process shown in FIG. 3A is executed to form a resist pattern on a silicon substrate, the resist pattern having an opening for an element isolation groove pattern in a semiconductor integrated circuit device area and for an alignment mark pattern. By using the resist pattern as a mask, trenches are etched in the silicon substrate to form steps. Element isolation shallow trenches and alignment marks are formed at the same time. The step is usually about 0.3 μm although it changes depending upon semiconductor integrated circuit devices to be manufactured. An oxide film burying the trench is formed and an unnecessary oxide film is removed by a CMP process to form the structure shown in FIG. 3B. By executing several processes, an insulating film shown in FIG. 3C is formed before contact holes are formed. In order to obtain alignment signals, it is necessary to recover the steps. As described with reference to FIG. 3D, a resist pattern exposing the alignment mark and its peripheral area is formed and the step is exposed by etching the insulating films.

As shown in FIG. 4A, alignment marks at upper right of five chips disposed at center, up and down, and right and left in a wafer are detected to obtain mark widths W1, W2, W3, W4 and W5. An average of these widths is set as the reference value Wref=AVERAGE (W1, W2, W3, W4, W5) of the mark width of the wafer. An allowable range R is set for $\Delta W=|W-Wref|$, and values in excess of R are removed as abnormal values and will not be referred to.

For example, the mark width is set at a designed value of 2 μm. Let's suppose that the width data of $W1x=2.16$, $W2x=2.15$, $W3x=2.14$, $W4x=2.15$, and $W5x=2.15$ are obtained as the finished groove width. In this case, Wxref is 2.15 μm are obtained as the finished grove width. Similarly, Wyref is determined as 2.15 μm. Considering a process variation and an allowable position detection variation, the allowable range R is set for example, to 0.10 μm and values in the range of 2.05 to 2.25 μm are allowed.

FIG. 4B is a graph showing detected mark widths in the order of exposed chips after actually detecting the mark position of each chip, measuring the mark widths and removing the mark widths outside the allowable range. Detection of abnormal values such as shown in FIG. 3E can be avoided.

Focus adjustment is required also for EB exposure. Prior to the first position alignment of exposure, an alignment mark is scanned with an electron beam and a reflected electron signal is monitored. For example, by changing the focus of an objective lens, the focus condition is selected which presents a maximum peak intensity of a differential waveform. In this manner, an optimum focus can be determined. In this process, the mark widths can be sampled, and preliminary sampling and mark width measurement can be shared in common.

In some cases, the widths of marks formed in a layer under a workpiece layer have some distributions in a wafer in-plane due to distributions of etching and CMP of semiconductor processes, etc.

Figure 5A:
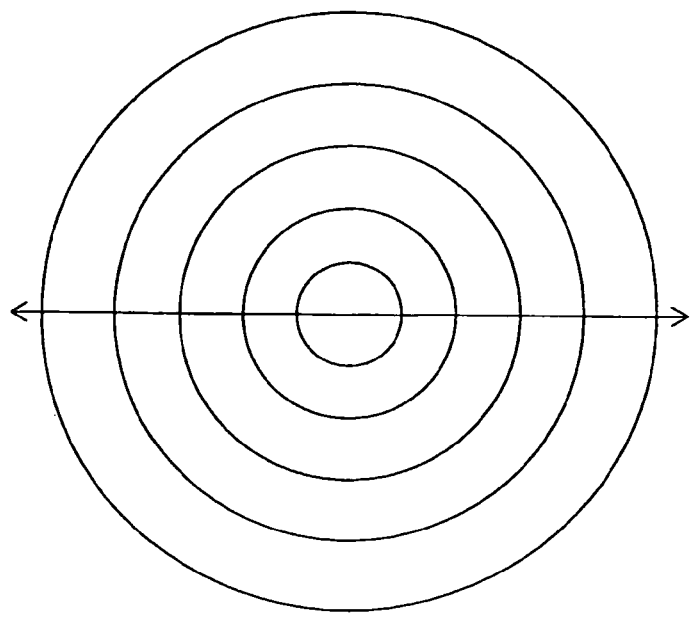
FIGS. 5A and 5B are a plan view and a graph illustrating an improved type of the first embodiment.
Figure 5B:
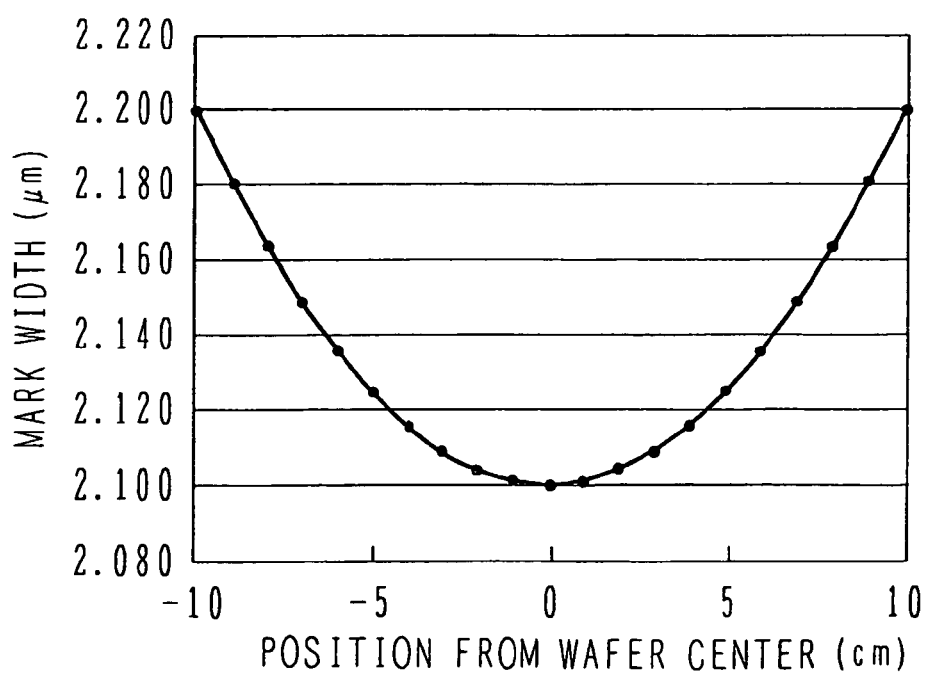

FIGS. 5A and 5B show distributions of the widths of alignment marks in a wafer. FIG. 5A is a plan view and FIG. 5B shows distributions of widths along a certain direction. It is necessary to correctly determine the mark width reference value in order to remove abnormal values at high precision. If the same reference value and allowable range are used for the whole wafer or a broad area of a wafer and if the allowable range is narrowed, many abnormal values will be detected and the number of allowable samples will be reduced. If the allowable range is broadened, even abnormal samples will be used as normal samples. Both cases are not suitable for removing abnormal values at high precision.

If the distribution has a predetermined tendency, abnormal values can be detected at higher precision by using the mark width reference value represented as a function of position. Many distribution tendencies have distributions having concentrical widths relative to the wafer center as shown in FIG. 5A.

In the case of the distribution of mark widths in a wafer in-plane due to some issues in processes of forming marks in a layer under a workpiece layer, it is effective to change the reference value in the wafer by using a flat plane, a curved plane or the like including a polynomial on the basis of sampled results, to remove abnormal values at high precision.

If the distribution changes in a parabolic shape, it is effective that this distribution is expressed by a quadratic function such as $W=ar^2+br+c$ (r is a distance from the center, $r^2=X^2+Y^2$). In the example shown in FIG. 5B, the curve can be well approximated by $a=0.001$ and $c=2.1$. The reference width at each position of the wafer was determined by this equation and abnormal values could be removed at high precision.

The function of a mark width relative to a mark position is not limited to this equation. The in-plane distribution can be approximated by linear equations including polynomial, quadratic equations different from the above-described quadratic equation, cubic or higher order equations, depending upon distributions.

In EB exposure, the position of each alignment mark is detected generally in the unit of group including the unit of chip, the unit of chip column and the like, and exposure is performed after alignment. In such a case, after the positions of alignment marks in a group are detected, the reference width, for example, an average width, is calculated, and remote abnormal values are removed or widths are measured again not to adopt abnormal value data. In this manner, position misalignment can be avoided.

Second Embodiment

Figure 6A:
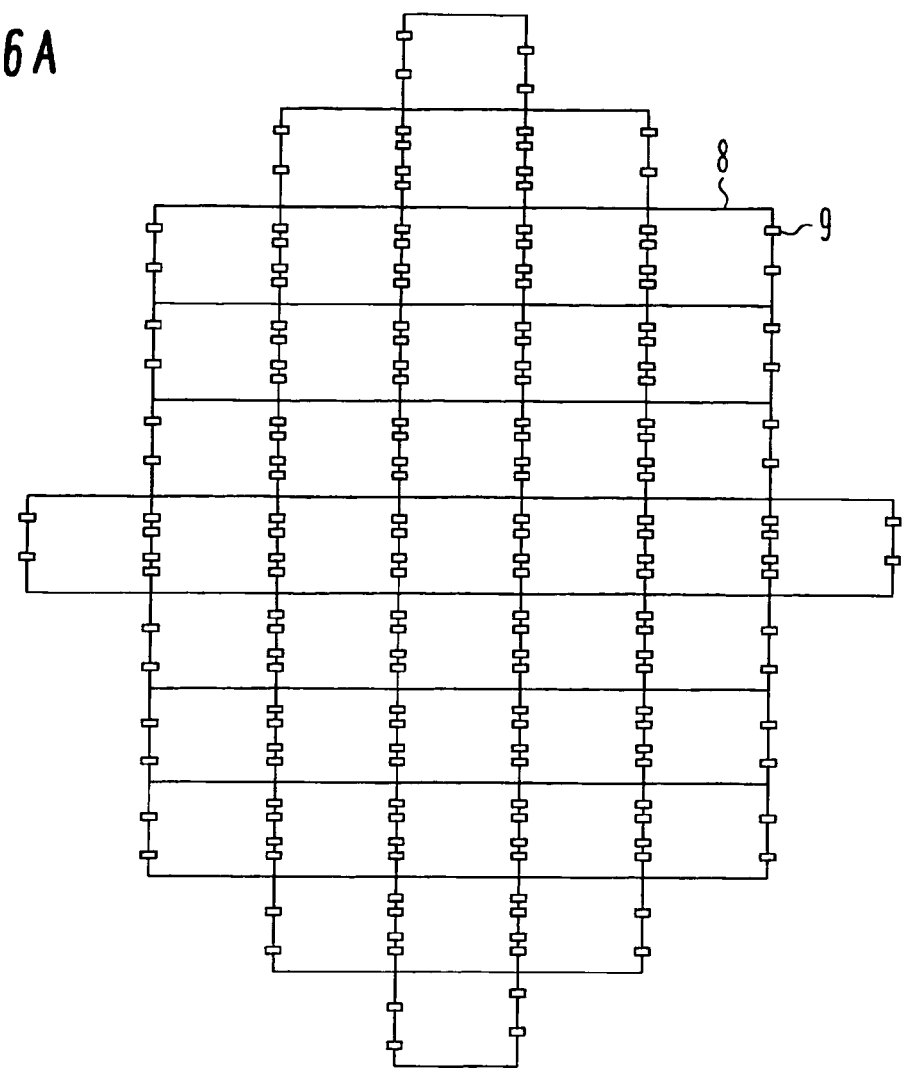
FIGS. 6A and 6B are plan views illustrating a second embodiment of the present invention.

FIG. 6A shows an example of the layout of alignment marks in a wafer. An alignment mark 9 is disposed near each of four corners of each chip 8 in the wafer.

Figure 6B:
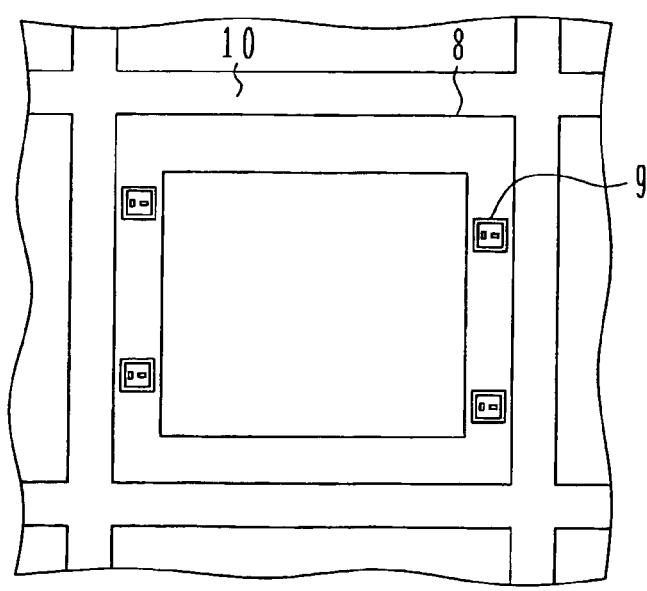

FIG. 6B is an enlarged view of one chip area. Alignment marks 9 are disposed without superposing upon scribe lines 10. If inspection after scribing is not necessary, alignment marks may be disposed superposing upon the scribe lines. In FIG. 6A, four alignment marks are disposed near each side of a chip, excepting the outermost side. These marks are assigned to two adjacent chips.

Alignment mark detection, alignment and exposure are repeated in the group unit including the unit of chip, the unit of chip column and the like. In this case, mark widths W1, W2, W3, W4 of each chip or mark widths W1(i), W2(i), W3(i), W4(i) of each group once obtained are used to determine the reference mark width of, for example, Wref=AVERAGE (W1, W2, W3, W4) or Wref=AVERAGE Σ(W1(i), W2(i), W3(i), W4(i)). The allowable range R of ΔW=|W−Wref| is set and abnormal values in excess of the allowable range are removed and not referred to. Other points are similar to the first embodiment. Similar to the first embodiment, erroneous detection can be avoided.

This embodiment does not require a preliminary process and can be used even if a local variation in mark widths in a wafer in-plane is very large. However, there is a demerit that if the reference width is determined in the chip unit, an abnormal value removal precision cannot be made too high because the number of reference points used to obtain the average is small. If a high precision abnormal value removal is necessary, it is preferable that a group is constituted of several chips to increase the number of reference points used to obtain the reference width, and then alignment mark detection, alignment and exposure are performed.

It is also possible that the same value is used as the mark widths at a position detection point along X- and Y-directions. If the X- and Y-direction detected widths measured at each position detection point are in excess of a predetermined difference value, these values are removed or widths are measured again not to adopt abnormal value data. In this manner, position misalignment can be avoided. Even if the distribution of mark sizes in the wafer in-plane in the mark forming layer is large, the influence of the distribution is small and the embodiment is particularly effective for such a case.

Third Embodiment

Figure 7:
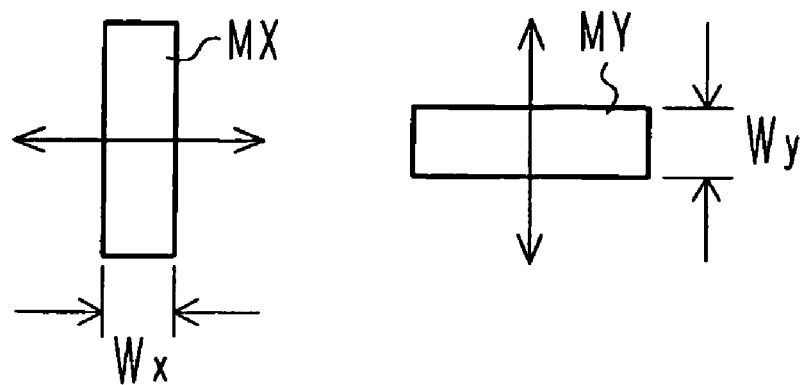
FIG. 7 is a plane view illustrating a third embodiment of the present invention.

As shown in FIG. 7, an alignment mark at each position is constituted of a pair of an X-direction mark MX and a Y-direction mark MY. Namely, each alignment mark 9 shown in FIG. 6A is constituted of two marks MX and MY. The widths of the X- and Y-direction marks MX and MY are the same.

The pair of X- and Y-direction marks are disposed in an area considered having the same process condition, and the X- and Y-direction marks are scanned alternately. An abnormal value is judged from a difference Δ=Wx−Wy between the X-direction mark width Wx and the Y-direction mark width Wy.

For example, a design value of the mark width is set to 2 μm and an allowable difference is set to 0.10 μm. If the mark width detection results of marks 1, 2, . . . are Wx1=2.10 μm, Wy1=2.11 μm, Wx2=2.40 μm, Wy2=2.10 μm, . . . , an XY difference of the second mark is in excess of the allowable difference. It is judged that there is an erroneous detection, and these values are removed from the position detection information. For example, if the width measured again is Wx2=2.10 μm, this mark width is adopted as the position detection information. With this process, large position misalignment can be avoided. An alignment mark may have a square shape, and a difference between X- and Y-direction widths of the mark is obtained.

A width is obtained as a first order difference between positions. A difference between X- and Y-direction widths is a second order difference of positions. The second order difference is not limited to a difference between widths along different directions, but other differences may be used.

Fourth Embodiment

Figure 8:
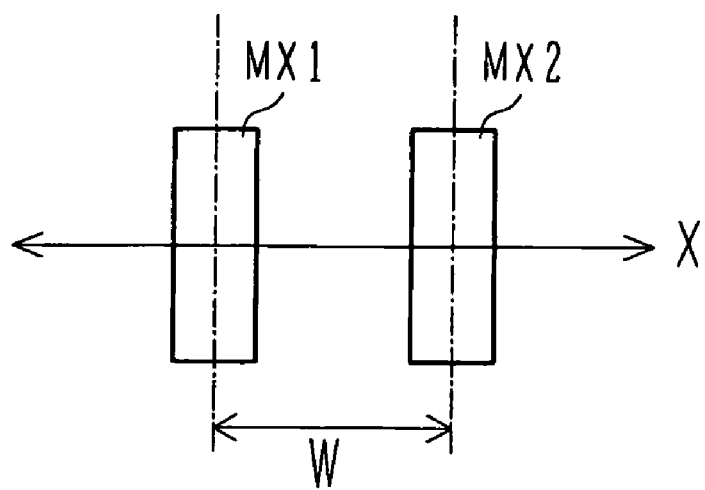
FIG. 8 is a plane view illustrating a fourth embodiment of the present invention.

As shown in FIG. 8, a plurality of alignment marks are disposed along the same direction at each measurement point. For example, alignment marks MX1 and MX2 long in the Y-direction are juxtaposed along the X-direction. Central portions of the marks MX1 and MX2 are obtained, and a mark width is set to a distance between the centers of the two alignment marks MX1 and MX2 along the width direction. Abnormal values can be effectively removed by using the mark width. The distance between marks is hard to be influenced by processes and takes a value near the design value. Therefore, even if the design value itself is adopted as the reference value, abnormal values can be removed at high precision, and it is efficient in that the reference value is not required to be set to each wafer or areas in a wafer. It is effective that if a plurality of mark widths are set to the same width, there is no difference between distances of patterns.

FIGS. 10A to 10G are cross sectional views illustrating main processes of a semiconductor device manufacture method including an alignment process of any one of the above-described embodiments. A semiconductor region is shown on the left side of each drawing and an alignment mark region is shown on the right side.

Figure 10A:
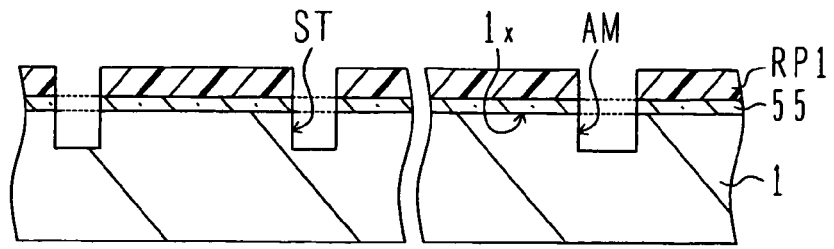
FIGS. 10A to 10G are cross sectional views illustrating main processes of a semiconductor device manufacture method according to an embodiment.

As shown in FIG. 10A, the surface of a silicon substrate 1 is thermally oxidized to form a buffer oxide film 1x, and thereafter a silicon nitride film 55 is deposited on the buffer oxide film by low pressure (LP) chemical vapor deposition (CVD). The silicon nitride film 55 is a film functioning as a stopper at later chemical mechanical polishing (CMP). On the silicon nitride film 55, a resist pattern RP1 is formed having openings for isolation trenches and alignment marks. The resist pattern RP1 is formed by optical exposure or EB exposure. By using the resist pattern RP1 as a mask, the silicon nitride film 55 is subjected to reactive ion etching (RIE) by using fluorine-containing etching gas, and thereafter the gas is changed to chlorine-containing etching gas and the silicon substrate 1 is subjected to RIE. An etching depth of the silicon substrate is, for example, about 300 nm. The resist pattern RP1 is thereafter removed. This process corresponds to the process shown in FIG. 3A. An isolation trench ST is formed in each chip area, and a groove as an alignment mark AM is formed in a peripheral area of each chip. For example, a minimum width of the shallow trench ST is about 200 nm and the mark width of an alignment mark is about 1 to 5 μm, although the widths depend upon the design of a semiconductor integrated circuit device.

Figure 10B:
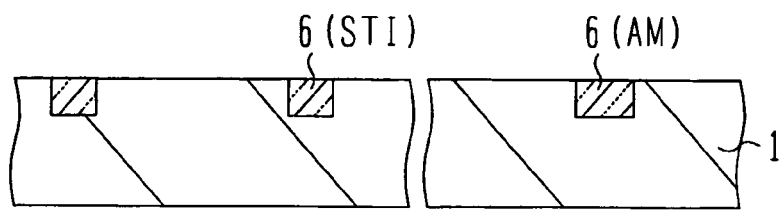

As shown in FIG. 10B, a silicon oxide film 6 is deposited by high density plasma (HDP) CVD to bury the shallow trench ST. At the same time, the alignment mark AM is also buried with the silicon oxide film 6. An unnecessary portion of the silicon oxide film is removed by CMP to planarize the surface of the substrate. The exposed silicon nitride film 55 is removed by hot phosphoric acid, and the buffer oxide film 1$x$ is etched and removed by dilute hydrofluoric acid. The shallow trench isolation STI and the alignment mark AM buried with the oxide film are therefore formed. This process corresponds to that shown in FIG. 3B.

Figure 10C:
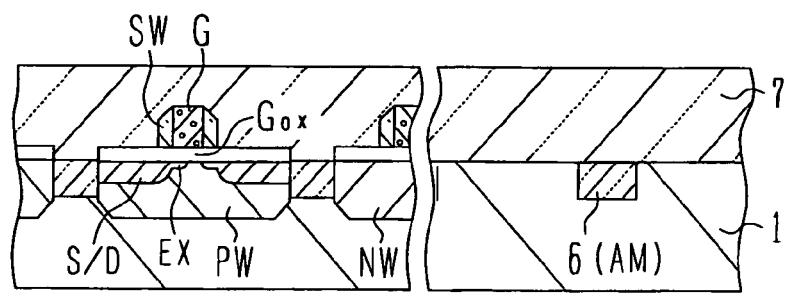

As shown in FIG. 10C, by using a resist mask, ions are implanted in the element region to form a p-type well PW and an n-type well NW. B or the like is used as p-type impurities, and P or the like is used as n-type impurities. The silicon oxide film on the surface of the silicon substrate is removed, and thermal oxidation is performed to grow a new gate oxide film Gox having a thickness of, e.g., 2 nm or thinner. If necessary, nitrogen is introduced into the gate oxide film and/or a high dielectric constant layer may be stacked on the gate oxide film. On the gate oxide film Gox, a polysilicon film is deposited by CVD, and a resist pattern is formed on the polysilicon film. The resist pattern may be a trimmed optical resist pattern or an EB resist pattern. By using the resist pattern as a mask, the polysilicon layer is etched to form gate electrodes G. The resist pattern is thereafter removed.

By using an area separation resist pattern, n-type impurity ions, e.g., P ions, are implanted into the p-type well PW to dope the impurities in the gate electrode G and form extension regions EX of source/drain on both sides of the gate electrode. For the n-type well NW, p-type impurity ions, e.g., B ions, are implanted. An insulating film such as a silicon oxide film is deposited and reactive ion etching (RIE) is performed to form side wall insulating films SW on the side walls of the gate electrode G. Then, n-type impurity ions are implanted into the p-type well PW and p-type impurity ions are implanted into the n-type well NW, to form high concentration source/drain regions S/D. After a MOS transistor structure is formed in this manner, an interlayer insulating film 7 of phosphosilicate glass (PSG) or the like is deposited by CVD. The surface of the interlayer insulating film is planarized by CMP. This state corresponds to that shown in FIG. 3C. Although only an n-channel MOS transistor formed in the p-type well PW is shown, a p-channel MOS transistor is also formed in the n-type well NW. Contact holes exposing the high concentration source/drain regions S/D of the MOS transistor are formed later by etching. This etching requires high precision and is performed by EB exposure with position alignment by alignment marks.

Figure 10D:
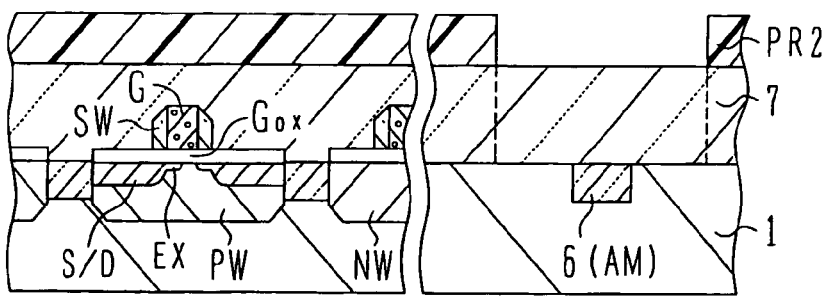

As shown in FIG. 10D, a resist pattern RP2 is formed having an opening exposing an area containing the alignment mark AM. The whole element region is covered with the resist pattern. This resist pattern has a precision of, e.g., about 0.5 µm and does not require high precision. Therefore, this resist pattern can be formed by optical exposure using an optical coarse alignment mechanism installed in an electron beam exposure system.

Figure 10E:
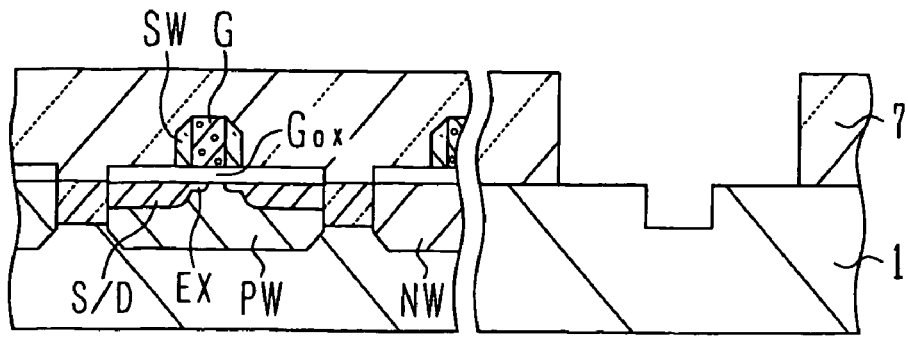

As shown in FIG. 10E, the interlayer insulating film 7 exposed in the opening is subjected to RIE by fluorine-containing gas, and then the oxide silicon film 6 buried in the trench of the alignment mark AM is subjected to RIE. The resist pattern RP2 is thereafter removed. A step of the silicon substrate is exposed in the alignment mark AM.

Figure 10F:
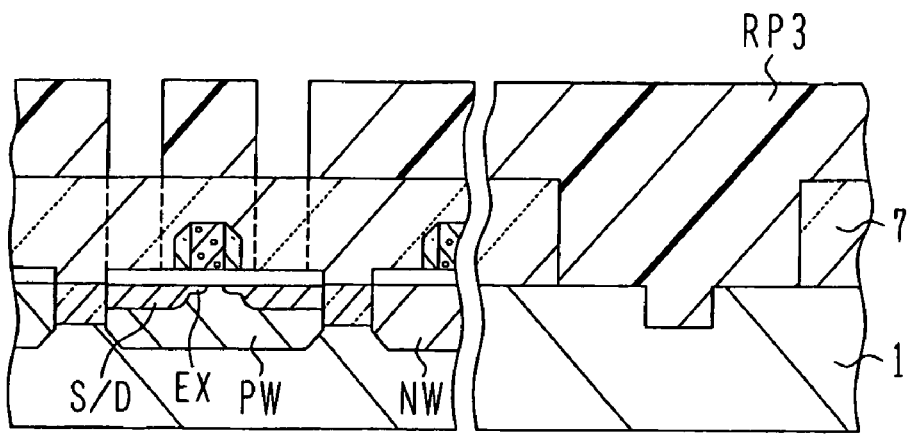

As shown in FIG. 10F, a resist film for an electron beam exposure is coated and the alignment mark is detected by using an electron beam. The resist film is almost transparent to an electron beam so that the step of the alignment mark can be detected easily. After a high precision alignment is established by using an electron beam, an electron beam exposure and development is performed to form a resist pattern RP3 for contact hole formation. By using the resist pattern RP3 as an etching mask, the interlayer insulating film 7 is subjected to RIE by fluorine-containing gas. Contact holes are therefore formed reaching the source/drain regions S/D. The alignment mark area is maintained in the state that it is covered with the resist pattern RP3. The resist pattern RP is thereafter removed.

Figure 10G:
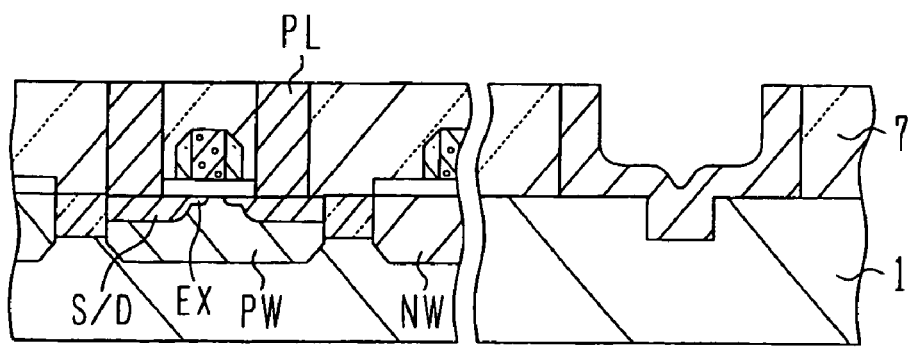

Thereafter, as shown in FIG. 10G, a barrier film such as a TiN film is formed and then a tungsten film is deposited by CVD using WF$_6$ to bury the contact holes. Unnecessary metal films deposited on the interlayer insulating film 7 are removed by CMP to form conductive plugs PL burying the contact holes.

Thereafter, multi-layer wirings are formed by usual processes. Alignment marks for the multi-layer wiring forming process may be steps of alignment marks formed in the substrate and exposed again or alignment marks formed at the same time when a new wiring is formed.

FIGS. 11A to 11D illustrate a via hole forming process to form multi-layer wirings. The processes shown in FIGS. 10A to 10G form the n-channel MOS transistor NMOS, p-channel MOS transistor PMOS, cover the transistors with the interlayer insulating film 7, and form the conductive plugs PL for the source/drain regions S/D.

Figure 11A:
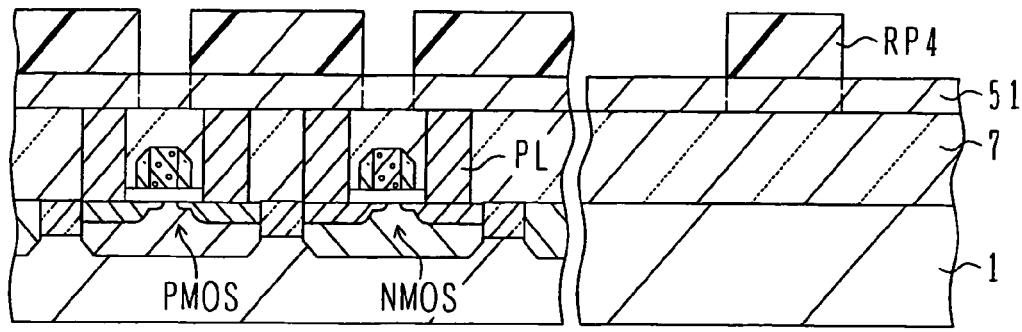
FIGS. 11A to 11D are cross sectional views illustrating main processes of a semiconductor device manufacture method according to an embodiment.

As shown in FIG. 11A, a metal wiring layer 51 of aluminum or the like is deposited on a semiconductor wafer. A resist pattern RP4 is formed on the metal wiring layer 51 for patterning wirings and alignment marks. The resist pattern RP4 may be either an optical resist or an EB resist. If necessary, the alignment marks shown in FIGS. 10D and 10E may be recovered. By using the resist pattern RP4 as an etching mask, the metal wiring layer 51 is etched to form metal wirings and alignment marks. Inverter wirings are formed in the left area of the drawing. A metal pattern 51$x$ shown in the right area of the drawing is an alignment mark.

Figure 11B:
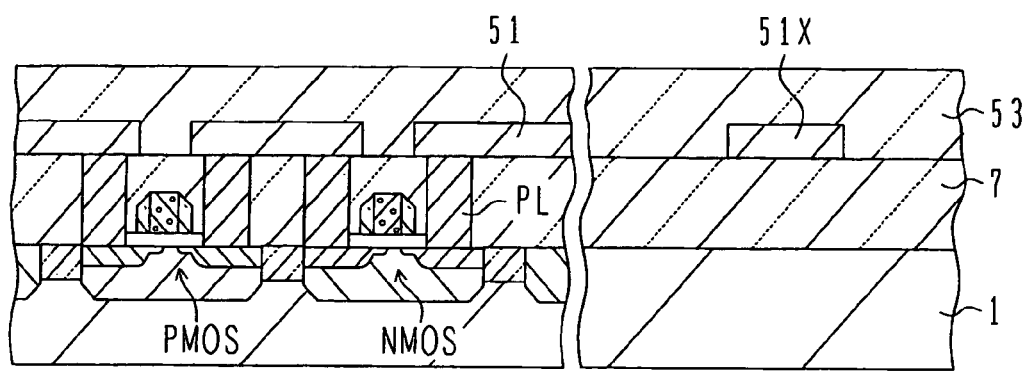

As shown in FIG. 11B, an interlayer insulating film 53 of silicon oxide or the like is deposited by CVD, covering the patterned metal wiring layer. Similar to the process shown in FIG. 10D, a resist pattern is formed having an opening exposing an area 54 including the alignment mark, and the interlayer insulating film 53 is etched to expose the alignment mark 51$x$.

Figure 11C:
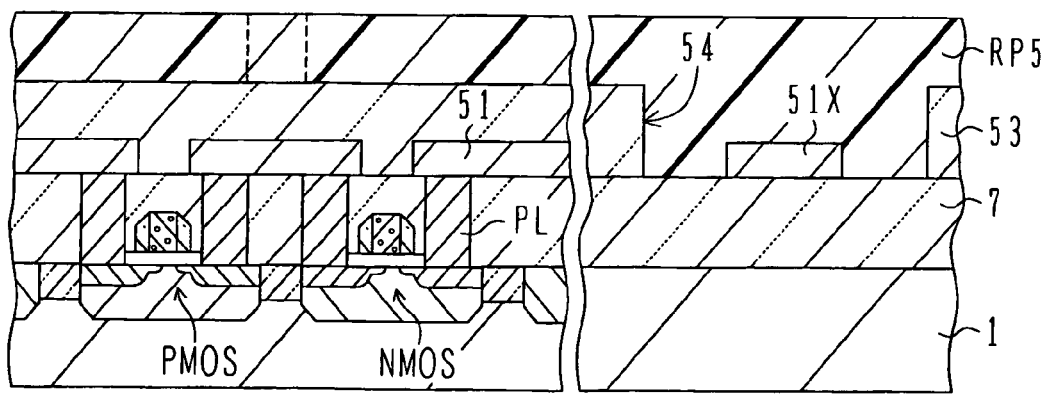

As shown in FIG. 11C, an EB resist layer RP5 is coated. The alignment mark 51$x$ is detected by scanning an electron beam. As described earlier, plural position information is obtained to calculate a difference. Abnormal values are removed by using the difference. In accordance with the position information on the alignment marks with the abnormal values being removed, an opening for forming a via hole reaching the wiring pattern 51 is subjected to exposure.

Figure 11D:
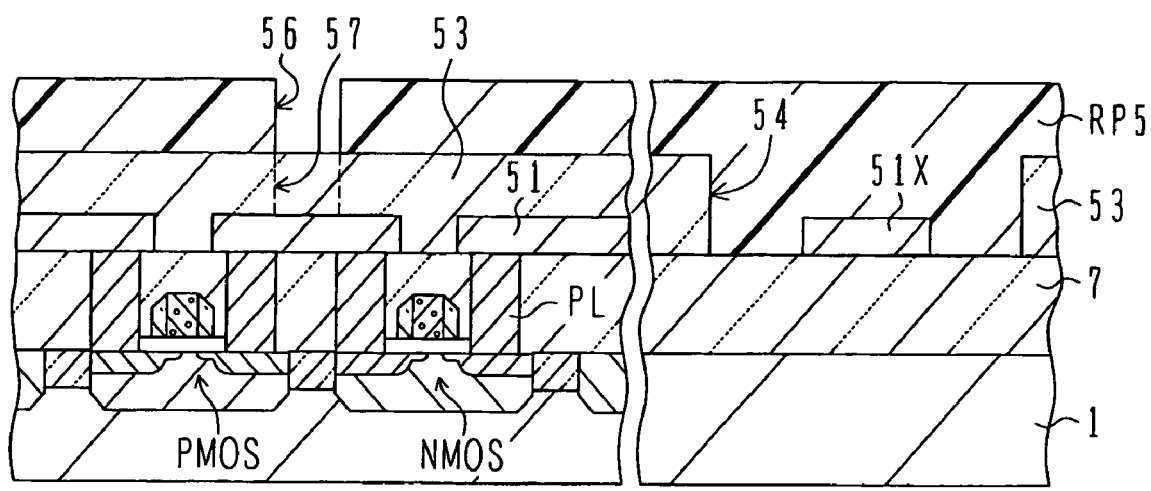

As shown in FIG. 11D, by using the resist pattern RP5 formed with an opening 56 as an etching mask, the interlayer insulating film 53 is etched to form a via hole 57. The resist pattern RP5 is thereafter removed, and a conductive layer is formed burying the via hole. The conductive layer deposited on the interlayer insulating film 53 is removed to complete the via conductor. This process is similar to the process shown in FIG. 10G.

The present invention has been described in connection with the preferred embodiments. The invention is not limited only to the above embodiments. For example, the gate electrode may be made of polycide, metal or the like. The conductive plug may be made of silicon, TiN or the like in addition to tungsten. The MOS transistor may have pocket regions of an opposite conductivity type surrounding the extension regions of the source/drain. An EB resist film may have a multi-layer structure in addition to a single layer struc- What are claimed are:

1. A semiconductor device manufacture method comprising steps of:
   (a) forming a semiconductor device structure in a chip and alignment marks, respectively in a semiconductor wafer, each of the alignment marks being constituted of a step or steps formed in the semiconductor wafer;
   (b) forming a workpiece layer above said semiconductor wafer covering the alignment marks;
   (c-1) forming a mask pattern over the workpiece layer;
   (c-2) etching the workpiece layer using the mask pattern as a mask, and exposing said alignment marks;
   (d) coating an electron beam resist film on said workpiece layer and on the exposed alignment marks;
   (e) scanning said steps of said exposed alignment marks with an electron beam to obtain plural position information of said alignment marks, said position information being represented in numerical values, and obtaining numerical differences between pairs among said plural position information of the alignment marks;
   (f) removing abnormal values of position information in accordance with the numerical differences between said pairs among said plural position information of the alignment marks, while retaining normal values of position information; and
   (g) performing an electron beam exposure in accordance with said retained normal values of said plural position information of said alignment marks.

2. The semiconductor device manufacture method according to claim 1, wherein:
   the obtained numerical differences between pairs among said plural position information represent a width of each of said alignment marks, as a first order difference; and
   said removing removes the abnormal value by comparing the width of each alignment mark with a reference value of width of said alignment marks.

3. The semiconductor device manufacture method according to claim 1, wherein the difference of said plural position information at said step (e) is a second order difference of said plural position information.

4. The semiconductor device manufacture method according to claim 1, wherein
   said scanning includes:
   (e-1) preliminarily scanning an electron beam on alignment marks at a plurality of points on a wafer in-plane and determining a reference value in accordance with a plurality of numerical differences between pairs among plural preliminary position information obtained by the preliminary scanning; and
   (e-2) scanning each alignment mark on the wafer in-plane and obtaining a pair of position information on each alignment mark and a numerical difference between the pair of position information of each alignment mark, and
   said removing includes:
   (f-1) obtaining deviation of the numerical difference between the pair of position information of each alignment mark, from said reference value; and
   (f-2) comparing said deviation with a specified value, and removing abnormal values of position information in accordance with the difference between said deviation and said specified value.

5. The semiconductor device manufacture method according to claim 1, wherein said (e), (f) and (g) are repetitively executed in a group unit constituted of one chip to several chips.

6. The semiconductor device manufacture method according to claim 1, wherein said (a) forms shallow trench isolations as the semiconductor device structure, and said alignment mark is a concave portion which is formed in said semiconductor wafer buried with an insulator at the same time said shallow trench isolations are formed, and thereafter the insulator is removed.

7. The semiconductor device manufacture method according to claim 1, wherein said alignment marks are concave portions.

8. The semiconductor device manufacture method according to claim 3, wherein:
   said step (e) obtains position information of each alignment mark in X- and Y-directions, widths of each alignment mark in the X- and Y-directions as a first order difference, and a difference between X- and Y-direction widths as a second order difference; and
   said step (f) removes the abnormal values by comparing the difference between the X- and Y-direction widths of each alignment mark with a specified value.

9. The semiconductor device manufacture method according to claim 3, wherein:
   said step (a) disposes a plurality of alignment marks at each sampling point along a same direction;
   said step (e) scans said plurality of alignment marks at each sampling point along the same direction, obtains a center position of each alignment mark as a first order difference, and a distance between center positions as the second order difference; and
   said step (f) removes the abnormal values by comparing said distance between center positions with a specified value.

10. The semiconductor device manufacture method according to claim 4, wherein the determined reference value is an average of widths of said preliminarily scanned alignment marks.

11. The semiconductor device manufacture method according to claim 4, wherein said reference value is expressed as a function of a position on the wafer in-plane.

12. The semiconductor device manufacture method according to claim 4, wherein each of said alignment mark includes a pair of patterns, and said numerical difference is a distance between the pair of patterns.

13. A semiconductor device manufacture method comprising:
   (a) forming a semiconductor device structure in a chip and alignment marks, respectively in a semiconductor wafer;
   (b) forming a workpiece layer above said semiconductor wafer covering the alignment marks;
   (c-1) forming a mask pattern over the workpiece layer;
   (c-2) etching the workpiece layer using the mask pattern as a mask, and exposing said alignment marks;
   (d) coating an electron beam resist film on said workpiece layer and on the exposed alignment marks;
   (e) scanning said exposed alignment marks with an electron beam to obtain plural position information of said alignment marks, said position information being represented in numerical values, and obtaining numerical differences between pairs among said plural position information of the alignment marks;
   (f) removing abnormal values of position information in accordance with the numerical difference between said pairs among said plural position information of the alignment marks, while retaining normal values of position information; and (g) performing an electron beam exposure in accordance with plural position information of said alignment marks with the abnormal values being removed, wherein:

the differences of said plural position information is a width of each of said alignment marks; and the abnormal values are removed by comparing the width of each alignment mark with a reference value of width of said alignment marks.

14. The semiconductor device manufacture method according to claim 13, wherein said alignment marks are concave portions.

15. A semiconductor device manufacture method comprising:

(a) forming a semiconductor device structure in a chip and alignment marks, respectively in a semiconductor wafer;

(b) forming a workpiece layer above said semiconductor wafer covering the alignment marks;

(c-1) forming a mask pattern over the workpiece layer;

(c-2) etching the workpiece layer using the mask pattern as a mask, and exposing said alignment marks;

(d) coating an electron beam resist film on said workpiece layer and on the exposed alignment marks;

(e) scanning said exposed alignment marks with an electron beam to obtain plural position information of said alignment marks, said position information being represented in numerical values, and obtaining numerical differences between pairs among said plural position information of the alignment marks;

(f) removing abnormal values of position information in accordance with the numerical differences between said pairs among said plural position information of the alignment marks, while retaining normal values of position information; and (g) performing an electron beam exposure in accordance with said retained normal values of said plural position information of said alignment marks, wherein the obtained numerical differences between pairs among said plural position information represent a width of each of said alignment marks, as a first order difference; and said removing removes the abnormal values by comparing the width of each alignment mark with a reference value of width of said alignment marks.

16. The semiconductor device manufacture method according to claim 15, wherein said (e), (f) and (g) are repetitively executed in a group unit constituted of one chip to several chips.

17. The semiconductor device manufacture method according to claim 15, wherein said forming the semiconductor device structure and alignment marks forms shallow trench isolations as the semiconductor device structure, and said alignment mark is a concave portion formed in said semiconductor wafer and buried with an insulator at the same time said shallow trench isolations are formed, and thereafter the insulator is removed.

18. The semiconductor device manufacture method according to claim 15, wherein said alignment marks are concave portions.

19. A semiconductor device manufacture method comprising:

(a) forming a semiconductor device structure in a chip and alignment marks, respectively in a semiconductor wafer;

(b) forming a workpiece layer above said semiconductor wafer covering the alignment marks;

(c-1) forming a mask pattern over the workpiece layer;

(c-2) etching the workpiece layer using the mask pattern as a mask, and exposing said alignment marks;

(d) coating an electron beam resist film on said workpiece layer and on the exposed alignment marks;

(e) scanning said exposed alignment marks with an electron beam to obtain plural position information of said alignment marks, said position information being represented in numerical values, and obtaining numerical differences between pairs among said plural position information of the alignment marks;

(f) removing abnormal values of position information in accordance with the numerical differences between said pairs among said plural position information of the alignment marks, while retaining normal values of position information; and (g) performing an electron beam exposure in accordance with said retained normal values of said plural position information of said alignment marks; wherein said scanning includes:

(e-1) preliminarily scanning an electron beam on alignment marks at a plurality of points on a wafer in-plane and determining a reference value in accordance with a plurality of numerical differences between pairs among plural preliminary position information obtained by the preliminary scanning; and (e-2) scanning each alignment mark on the wafer in-plane and obtaining a pair of position information on each alignment mark and a numerical difference between the pair of position information of each alignment mark, and said removing includes:

(f-1) obtaining deviation of the numerical difference between the pair of position information of each alignment mark, from said reference value; and (f-2) comparing said deviation with a specified value, and removing abnormal values of position information in accordance with the difference between said deviation and said specified value.

20. The semiconductor device manufacture method according to claim 19, wherein (e), (f) and (g) are repetitively executed in a group unit constituted of one chip to several chips.

21. The semiconductor device manufacture method according to claim 19, wherein said forming the semiconductor device structure and alignment marks forms shallow trench isolations as the semiconductor device structure, and said alignment mark is a concave portion formed in said semiconductor wafer and buried with an insulator at the same time said shallow trench isolations are formed, and thereafter the insulator is removed.

22. The semiconductor device manufacture method according to claim 19, wherein said alignment marks are concave portions.

* * * * *